(12) United States Patent
Hanafi et al.

(10) Patent No.: US 8,072,281 B2
(45) Date of Patent: Dec. 6, 2011

(54) METHOD, SYSTEM AND APPARATUS FOR ACCURATE AND STABLE LC-BASED REFERENCE OSCILLATORS

(75) Inventors: Bassel Hanafi, Nasr (EG); Sherif Hosny, Nasr (EG); Ayman Ahmed, Nasr (EG)

(73) Assignee: Si-Ware Systems Inc., Cairo (EG)

( * ) Notice: Subject to any disclaimer, the term of this patent is extended or adjusted under 35 U.S.C. 154(b) by 113 days.

(21) Appl. No.: 12/545,285

(22) Filed: Aug. 21, 2009

(65) Prior Publication Data

US 2010/0045394 A1    Feb. 25, 2010

Related U.S. Application Data

(60) Provisional application No. 61/189,809, filed on Aug. 23, 2008.

(51) Int. Cl.
*H03B 5/32* (2006.01)
(52) U.S. Cl. ............ 331/176; 331/66; 331/167
(58) Field of Classification Search .......... 331/167, 331/117 R, 176, 66
See application file for complete search history.

(56) References Cited

U.S. PATENT DOCUMENTS

| | | | | |
|---|---|---|---|---|
| 4,270,102 A | * | 5/1981 | Gawler et al. | 331/115 |
| 4,509,023 A | * | 4/1985 | Heimlicher | 331/176 |
| 4,916,412 A | * | 4/1990 | Nordholt et al. | 331/34 |
| 7,227,423 B2 | | 6/2007 | McCorquodale et al. | |
| 7,248,124 B2 | | 7/2007 | McCorquodale et al. | |
| 7,307,486 B2 | | 12/2007 | Pernia et al. | |
| 7,358,826 B2 | | 4/2008 | McCorquodale et al. | |
| 7,504,899 B2 | | 3/2009 | McCorquodale et al. | |
| 7,548,125 B2 | | 6/2009 | Carichner et al. | |
| 7,679,463 B2 | | 3/2010 | Pernia et al. | |
| 2008/0042765 A1 | | 2/2008 | Tarng | |
| 2008/0297265 A1 | | 12/2008 | Tarng | |
| 2009/0002085 A1 | | 1/2009 | Tarng | |
| 2009/0058386 A1 | | 3/2009 | Tarng | |
| 2009/0072875 A1 | | 3/2009 | Tarng | |
| 2009/0134947 A1 | | 5/2009 | Tarng | |
| 2009/0243732 A1 | | 10/2009 | Tarng | |

FOREIGN PATENT DOCUMENTS

| | | |
|---|---|---|
| EP | 0326202 A1 | 8/1989 |
| EP | 1542353 A1 | 6/2006 |
| JP | 59072205 A | 4/1984 |

OTHER PUBLICATIONS

Yu-Wei Lin, et al., "60-MHz wine-glass micromechanical-disk reference oscillator, " 2004 IEEE International Solid-State Circuits Conference (ISSCC), 2004, pp. 322, 530.

(Continued)

*Primary Examiner* — Joseph Chang
(74) *Attorney, Agent, or Firm* — Useful Arts IP

(57) ABSTRACT

A substantially temperature-independent LC-based oscillator is achieved using an LC tank that generates a tank oscillation at a phase substantially equal to a temperature null phase. The temperature null phase is a phase of the LC tank at which variations in frequency of an output oscillation of the LC-based oscillator with temperature changes are minimized. The LC-based oscillator further includes frequency stabilizer circuitry coupled to the LC tank to cause the LC tank to oscillate at the phase substantially equal to the temperature null phase.

21 Claims, 11 Drawing Sheets

OTHER PUBLICATIONS

B. P. Otis J. M. Rabaey, "A 300_W 1.9 GHz CMOS oscillator utilizing micromachined resonators, " IEEE Journal of Solid-State Circuits, Jul. 2003, vol. 38, No. 7.

J.J. Kim, et al., "Low phase noise, FBAR-based voltage controlled oscillator without varactor," 13th International Conference on Solid-state Sensors, Actuators and Microsystems, Seoul, Korea, Jun. 5-9, 2005, pp. 1063-1066.

A.P.S. Khanna, et al., "A 2 GHz voltage tunable FBAR oscillator," 2003 IEEE MTT-S Symposium Digest, Philadelphia, PA, 2003, pp. 717-720.

C. Ghidini, et al., "A digitally programmable on-chip RC-oscillator in 0.25 μm CMOS logic process," IEEE Int. Symp. Circuits and Systems (ISCAS), 2005, pp. 400-403.

Ting Ping Liu, et al., "A 250-MHz monolithic voltage-controlled oscillator with low temperature coefficient," IEEE Journal of Solid-State Circuits, Apr. 1990, pp. 555-561, vol. 25, No. 2.

Michael S. McCorquodale, et al., "A Monolithic and Self-Referenced RF LC Clock Generator Compliant With USB 2.0," IEEE Journal of Solid-State Circuits, Feb. 2007, pp. 385-399, vol. 42, No. 2.

R. Groves, et al., "Temperature dependence of Q and inductance in spiral inductors fabricated in a silicon-germanium/BiCMOS technology," IEEE Journal of Solid-State Circuits, Sep. 1997, pp. 1455-1459, vol. 32, No. 9.

[9] Janusz Groszkowski, "The Interdependence of Frequency Variation and Harmonic Content, and the Problem of Constant-Frequency Oscillators," Proceedings of the Institute of Radio Engineers, Jul. 1933, pp. 958-981, vol. 21, No. 7.

E. A. Vittoz, et al., "High-performance crystal oscillator circuits: theory and application," IEEE Journal of Solid-State Circuits, Jun. 1988, pp. 774-783, vol. 23, No. 3.

L. Romano, et al., "Multiphase LC oscillators," IEEE Transactions on Circuits and Systems-I: Regular Papers, Jul. 2006, pp. 1579-1588, vol. 53, No. 7.

A. Mirzaei, et al., "The quadrature LC oscillator: a complete portrait based on injection locking," IEEE Journal of Solid-State Circuits, Sep. 2007, pp. 1916-1932, vol. 42, No. 9.

\* cited by examiner

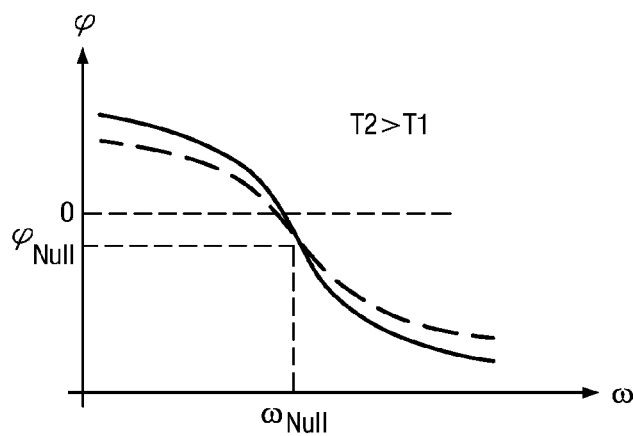
FIG. 17A
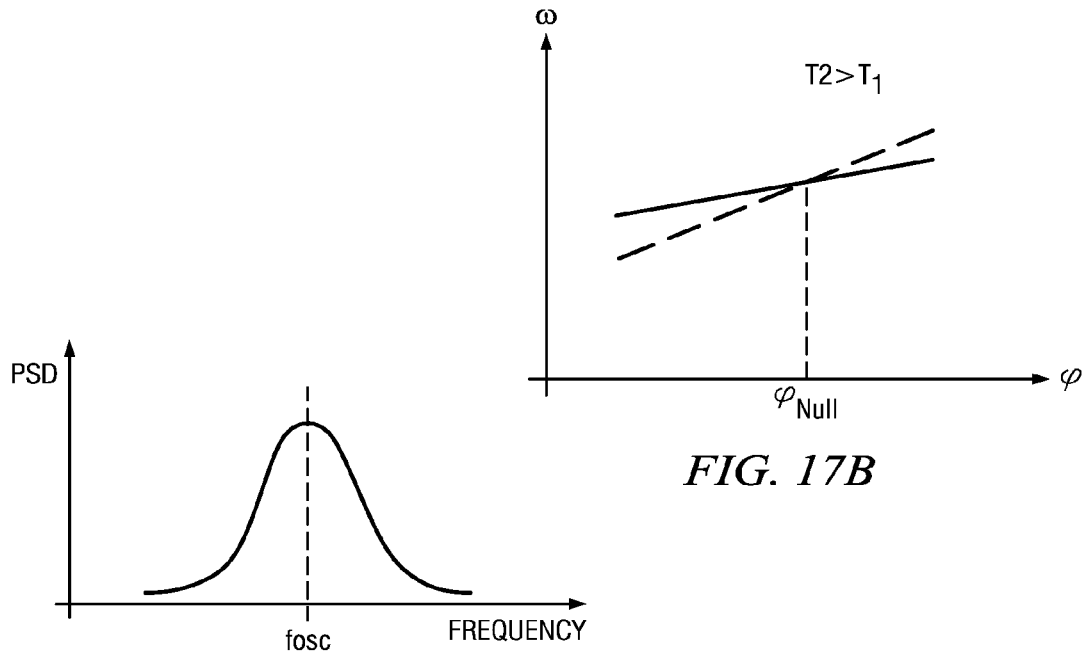
FIG. 17B
FIG. 18A
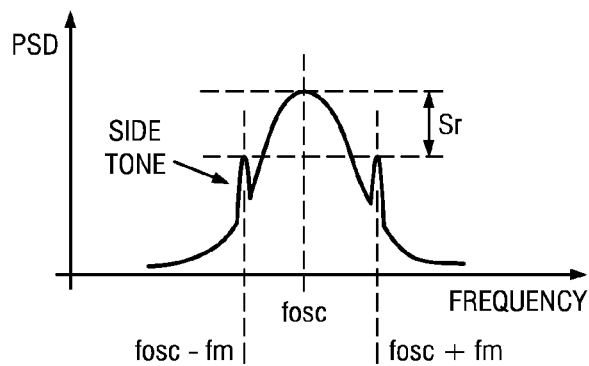
FIG. 18B

METHOD, SYSTEM AND APPARATUS FOR ACCURATE AND STABLE LC-BASED REFERENCE OSCILLATORS

CROSS REFERENCE TO RELATED PATENTS

This U.S. application for patent claims the benefit of the filing date of U.S. Provisional Patent Application entitled, Method, System and Apparatus for Accurate and Stable LC-Based Reference Oscillators, having Ser. No. 61/189,809, filed on Aug. 23, 2008, which is incorporated herein by reference for all purposes.

BACKGROUND OF THE INVENTION

1. Technical Field of the Invention

The present invention relates in general to oscillators, and in particular, to inductor-capacitor (LC) tank based oscillators.

2. Description of Related Art

Electronic clock generation classically relies on a reference oscillator based on an external crystal that is optionally multiplied and/or divided to generate the required clock. The key specifications of a clock, other than its target frequency, are frequency accuracy and stability. Frequency accuracy is the ability to maintain the target frequency across supply and temperature and is usually represented as drift from the target frequency in percent or ppm. Short term frequency stability is measured using period jitter which is dependent on the phase noise of the oscillator at large frequency offsets. Long term stability, on the other hand, is impacted by the close-in phase noise of the oscillator. An oscillator using a high-Q element typically has a low phase noise profile, and thus good frequency stability, and is less sensitive to variations in oscillator amplifier gain that is dependent on supply and temperature.

For example, crystal oscillators (XO) are high-Q oscillators that provide excellent frequency stability and frequency accuracy across supply and temperature stemming from the very high quality factor (Q) of the crystal. However, not all resonators, including crystals, have satisfactory performance across temperature, thus the need for extra circuitry and techniques to decrease and/or compensate for this shift in frequency due to temperature. A temperature compensated crystal oscillator (TCXO) typically incorporates extra devices that have temperature dependence to negate the temperature dependence of the crystal. The overall outcome is an oscillation frequency with low temperature dependence.

However, the ever increasing complexity of electronic systems due to requirements of supporting multiple standards, increased functionality, higher data rates and memory in a smaller size and at a lower cost is pushing designers to increase the integration level through the development of Systems on Chip (SoC) in deep submicron Complimentary MOS (CMOS) technologies to benefit from the increased gate density. Reference clocks incorporating crystal oscillators have not managed to scale or integrate due to the bulky nature of crystals, thus limiting the size and cost reduction possible for electronic systems.

Recent efforts in using high-Q MEMS resonators and Film Bulk Acoustic Resonators (FBARs) have illustrated possibilities of integrating a high-Q element and Application Specific Integrated Circuits (ASIC) in the same package. However, packaging induced stress impacting performance still remains as a challenging obstacle, since the high-Q element may require special packages and/or calibration that are not practical for SoC's. The stress may change the temperature behavior of the resonator, possibly resulting in large frequency shifts and accelerated aging. Therefore, special assembly and packaging techniques are typically required to mitigate such effects, which increase the cost of producing such clocks. Similar problems may be encountered by any resonator that is dependent on the mechanical properties of the resonator material, which require careful design and manufacturing procedures and processes.

Design requirements for applications such as USB and SATA, which do not require superior frequency accuracy and stability can be satisfied using oscillators with relatively low-Q elements available in a CMOS process which can have adequate phase noise profiles generating good jitter performance. Current trials include the use of ring oscillators, relaxation oscillators and LC oscillators. However, the reported frequency accuracy of these implementations suffers from large drift across supply and temperature, making them ineffective for applications requiring precise accuracy and stability. A mitigation to reduce the drift across temperature requires trimming across temperature which is neither cost effective nor practical for SoC's.

Therefore, the availability of an integrated solution relying on existing optimized process steps in a CMOS technology satisfying frequency stability and jitter requirements is of great value.

SUMMARY OF THE INVENTION

Embodiments of the present invention provide a substantially temperature-independent LC-based oscillator. The oscillator includes an LC oscillator tank that generates a tank oscillation at a phase substantially equal to a temperature null phase. The temperature null phase is a phase of the LC oscillator tank at which variations in frequency of an output oscillation of the oscillator with temperature changes are minimized. The oscillator further includes frequency stabilizer circuitry coupled to the LC oscillator tank to cause the LC oscillator tank to operate at the temperature null phase.

For example, in one embodiment, the temperature null phase is substantially equal to zero and the frequency stabilizer circuitry includes a series capacitive resistor within the LC oscillator tank having a value selected to enable a quality factor of the inductor (L) and capacitor (C) to be substantially equal across a temperature range of interest.

In another embodiment, the temperature null phase is non-zero, and the frequency stabilizer circuitry includes phase shift circuitry that operates to produce a phase substantially equal to a negative of the temperature null phase based on a phase control signal.

In yet another embodiment, the oscillator includes a first amplifier operable to inject a first current into the LC oscillator tank, and the frequency stabilizer circuitry includes a second amplifier coupled to the LC oscillator tank and operable to inject a second current into the LC oscillator tank. A phase shift between the first current and the second current produces a non-zero value of the phase in the LC oscillator tank based on a ratio between the first current and the second current. This ratio is chosen such that the oscillator operates at the temperature null phase.

In still another embodiment, two oscillators are coupled to one another in quadrature to enable each oscillator to operate at its respective temperature null phase. Each oscillator includes two amplifiers coupled to inject a combined current into the respective LC oscillator tank that causes the LC oscillator tank to oscillate at a non-zero phase which is set to be substantially equal to the temperature null phase. The phase is set based on the ratio between the currents injected by each amplifier. In a further embodiment, automatic amplitude control circuitry measures the amplitude of the respective outputs of the oscillators and generates a control signal to control the oscillation amplitude such that the amplifiers are operating in their linear region, thus decreasing any harmonics which may have an adverse affect on the oscillator temperature dependence.

In another embodiment, the frequency stabilizer circuitry further includes a phase locked loop (PLL) or delay locked loop (DLL) having a phase detector coupled to receive the output oscillation and a feedback signal and operable to generate a phase error output signal indicative of a difference in phase between the output oscillation and the feedback signal, in which the phase error output signal is equal to zero when the output oscillation and the feedback signal are shifted by a constant phase. A Voltage Controlled Oscillator (VCO) or Voltage Controlled Delay Line (VCDL) receives the filtered phase error output and produce the feedback signal. A programmable coupling circuit coupled to VCO/VCDL provides a fraction of the feedback signal to the oscillator to cause the LC oscillator tank to oscillate at a non-zero phase. The coupling factor is chosen such that the oscillator tank has a phase substantially equal to the temperature null phase.

In another embodiment, the frequency stabilizer circuitry includes a heating element operable to apply a temperature excitation signal superimposed on an operating temperature of the oscillator, a demodulator coupled to the oscillator to receive the output oscillation and operable to demodulate the output oscillation to produce a frequency deviation signal indicative of a frequency deviation produced by the oscillator in response to the temperature excitation signal, a frequency error generator coupled to receive the frequency deviation signal and the temperature excitation signal and operable to produce an error signal proportional to the sensitivity of the oscillator frequency to temperature and a comparator coupled to receive the error signal and a reference signal and operable to produce a control signal to control the oscillator to allow the LC oscillator tank to operate at the temperature null phase. At steady state, the error signal has an average value equal to the reference signal.

Embodiments of the present invention further provide a method for operating an LC-based oscillator. The method includes determining a temperature null phase of an LC oscillator tank of the LC-based oscillator, in which the temperature null phase is a phase at which variations of frequency of an output oscillation of the LC-based oscillator with temperature changes are minimal. The method further includes providing frequency stabilizer circuitry to cause the LC oscillator tank to operate at a phase substantially equal to the temperature null phase and operating the LC-based oscillator with the LC oscillator tank oscillating at the temperature null phase.

BRIEF DESCRIPTION OF THE DRAWINGS

A more complete understanding of the present invention may be obtained by reference to the following detailed description when taken in conjunction with the accompanying drawings wherein:

FIGS. 17A and 17B illustrate exemplary temperature trimming operations in accordance with embodiments of the present invention;

FIGS. 18A and 18B illustrate an exemplary oscillator output spectrum with and without temperature modulation.

DETAILED DESCRIPTION OF THE DRAWINGS

Figure 1:
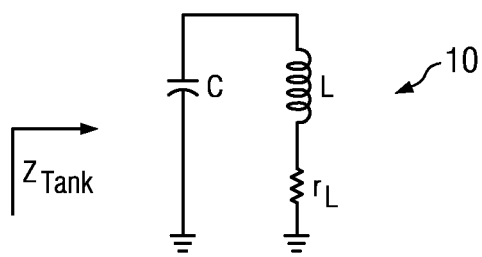
FIG. 1 is a circuit diagram illustrating an exemplary LC oscillator tank in accordance with embodiments of the present invention.

Referring now to FIG. 1, an LC oscillator tank circuit 10 used in building oscillators is composed of a source of inductance (inductive element) L and capacitance (capacitive element) C. The inductive element L and capacitive element C in the LC oscillator tank circuit 10 can be composed of various types of resonators and passive elements, such as but not limited to, on-chip integrated inductors, bond-wires, Metal-Insulator-Metal (MiM) Capacitors, Metal Finger Capacitors, Metal Oxide Semiconductor (MOS) capacitors, ceramic resonators, Micro Electro-Mechanical Systems (MEMS) tuning fork resonators, MEMS wine-glass resonators, MEMS-based resonators, Surface Acoustic Wave (SAW) and Bulk Acoustic Wave (BAW) devices.

The implementation of an ideal pure inductor or capacitor is usually not possible due to the physical limitations of having a finite quality factor Q. Integrated inductors in CMOS technology to date have low Q factors when compared to MEMS resonators and crystals. Of the sources of losses in an inductor are the inductor metal ohmic losses $r_L$ and substrate resistive losses $r_{SUB}$. Both of these losses are usually temperature dependent, and therefore, the overall impedance and Q of the inductor is temperature dependent.

The integrated capacitive part of the tank also suffers from a finite temperature dependent Q as well as temperature dependence of the capacitance value. As a result, the physical implementation of an integrated LC-tank will dictate a strong temperature dependence of the impedance and Q factor of the tank, which may result in a temperature dependent tank resonance frequency.

Thus, an oscillator built using an LC oscillator tank 10 typically includes an amplifier responsible for overcoming the tank losses. For the oscillator to have sustained oscillations, the Barkhausen criterion requires an open loop gain greater than 1 and phase equal to zero. Assuming that the amplifier contributes a zero phase, then for oscillation to occur, the LC oscillator tank impedance $Z_{Tank}$ must have a zero phase. The phase condition is used to derive the oscillation frequency $\omega_{osc}$ as follows:

$$Z_{Tank} = \frac{r_L + j\omega L}{1 + j\omega r_L C - \omega^2 LC}, \quad \text{(Equation 1)}$$

$$\varphi_{Tank} = \tan^{-1}\frac{\omega L}{r_L} - \tan^{-1}\frac{\omega r_L C}{1 - \omega^2 LC}, \quad \text{(Equation 2)}$$

with an oscillation condition of $\varphi_{Tank}=0$ such that:

$$\omega_{osc} = \omega_o \cdot \sqrt{1 - \frac{r_L^2 C}{L}}, \text{ where } \omega_o = \frac{1}{\sqrt{LC}}. \quad \text{(Equation 3)}$$

From the above equations 1-3, it can be seen that the oscillation frequency is temperature dependent if $r_L$ is temperature dependent. A linear variation of $r_L$ with temperature results in an almost linear variation of the oscillation frequency. In addition, any temperature variation in C would strongly contribute to the temperature dependence.

Figure 2:
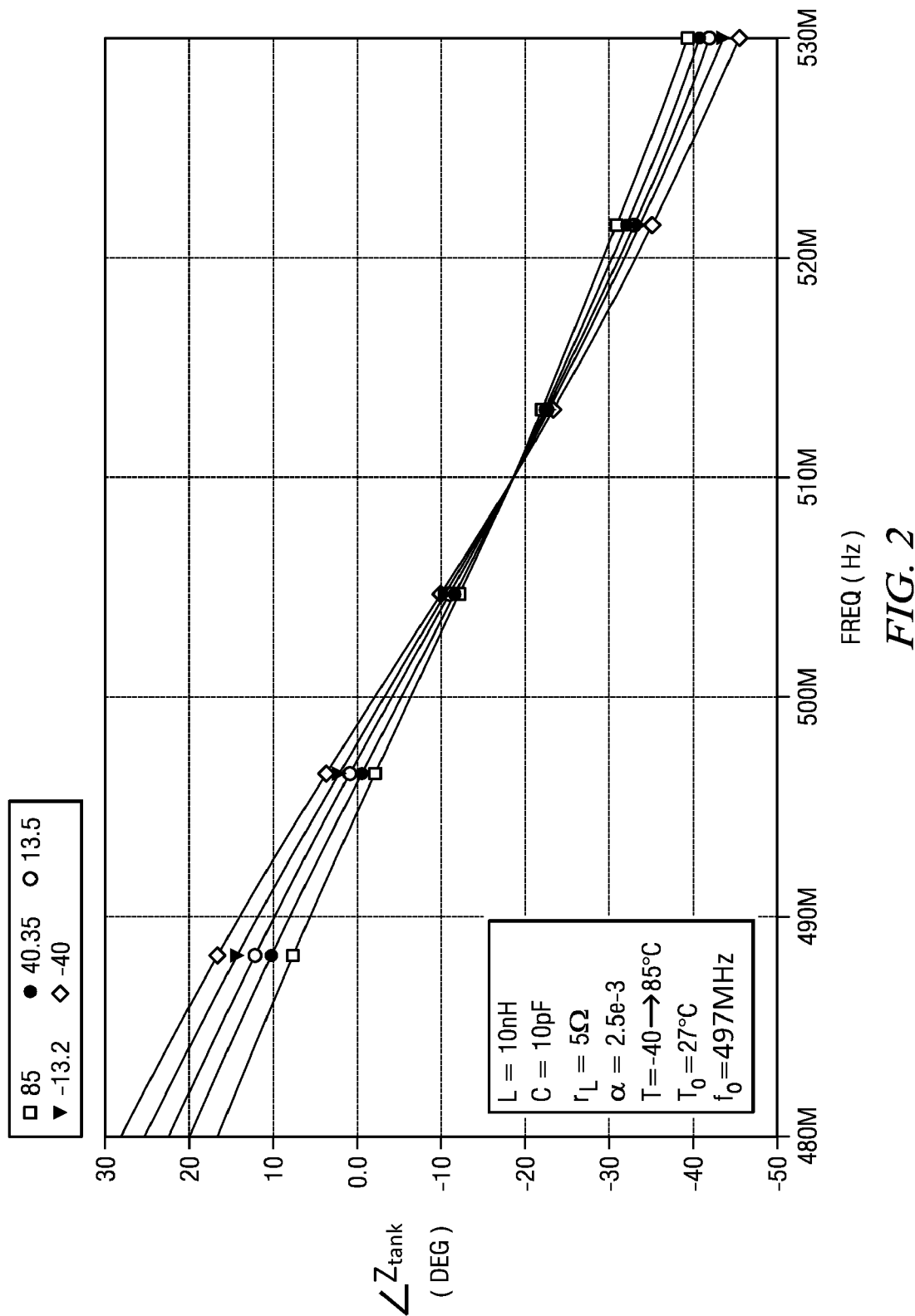
FIG. 2 illustrates phase plots of an exemplary LC oscillator tank in accordance with embodiments of the present invention.

This is graphically shown in FIG. 2, where $\varphi_{Tank}$ is plotted for different temperatures for a tank composed of L, $r_L$ and C with linear temperature dependence of $r_L$ defined as:

$$r_L = r_o \cdot (1+\alpha \cdot (T-T_o)), \quad \text{(Equation 4)}$$

where $\alpha$ is the temperature coefficient of $r_L$.

Figure 3:
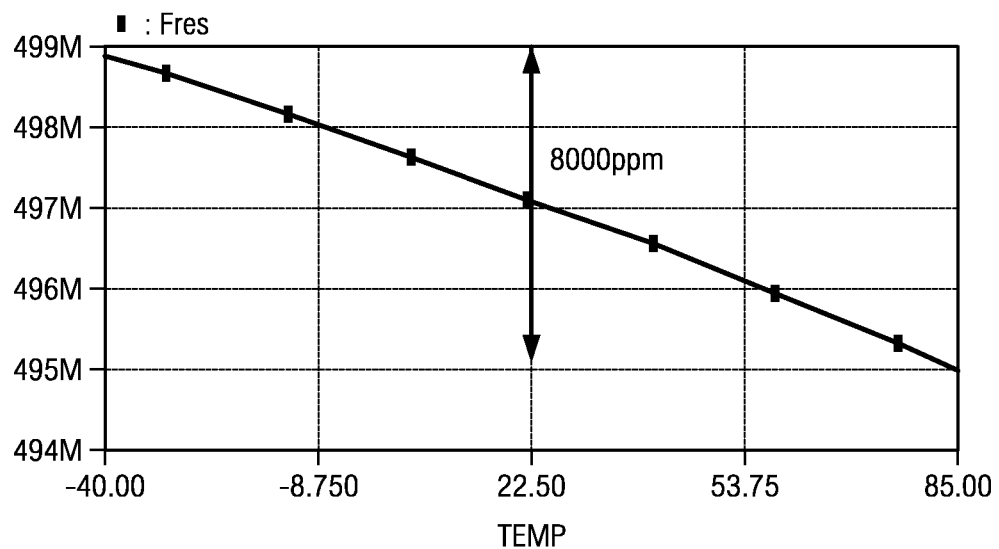
FIG. 3 illustrates the oscillation frequency across temperature of an LC oscillator tank operating at zero phase.

It is to be noted that the oscillation frequency is determined using the intersection of $\varphi_{Tank}=0$ with the phase plots. The corresponding oscillation frequency across temperature is plotted in FIG. 3, showing a strong temperature dependence of 8000 ppm in a typical LC oscillator tank operating at zero phase.

Examining the phase plots again in FIG. 2, since the quality factor of the tank changes with temperature, the phase plots change with temperature. In addition, at the oscillation frequency, there is a higher Q at lower temperatures, and therefore, a larger negative slope is seen at lower temperatures. Therefore, the varying phase plot slopes with temperature result in the intersection of these plots.

When the intersections occur at the same phase, a temperature insensitive tank operating point is created, and the tank is said to be operating at a temperature "null" with a phase $\varphi_{Null}$. The ideal temperature null phase occurs when the phase plots across temperature intersect at precisely the same phase. Oscillation with a phase across the tank of and ideal $\varphi_{Null}$ results in an oscillation frequency with zero deviation across temperature.

Figure 5:
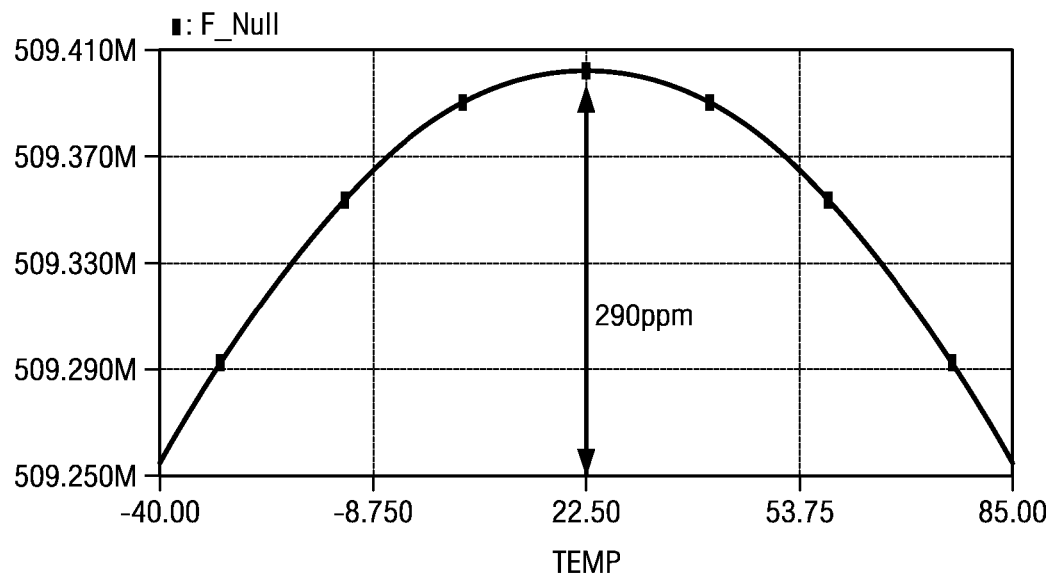
FIG. 5 illustrates frequency deviation across temperature while operating at the temperature null phase in accordance with embodiments of the present invention.
Figure 4:
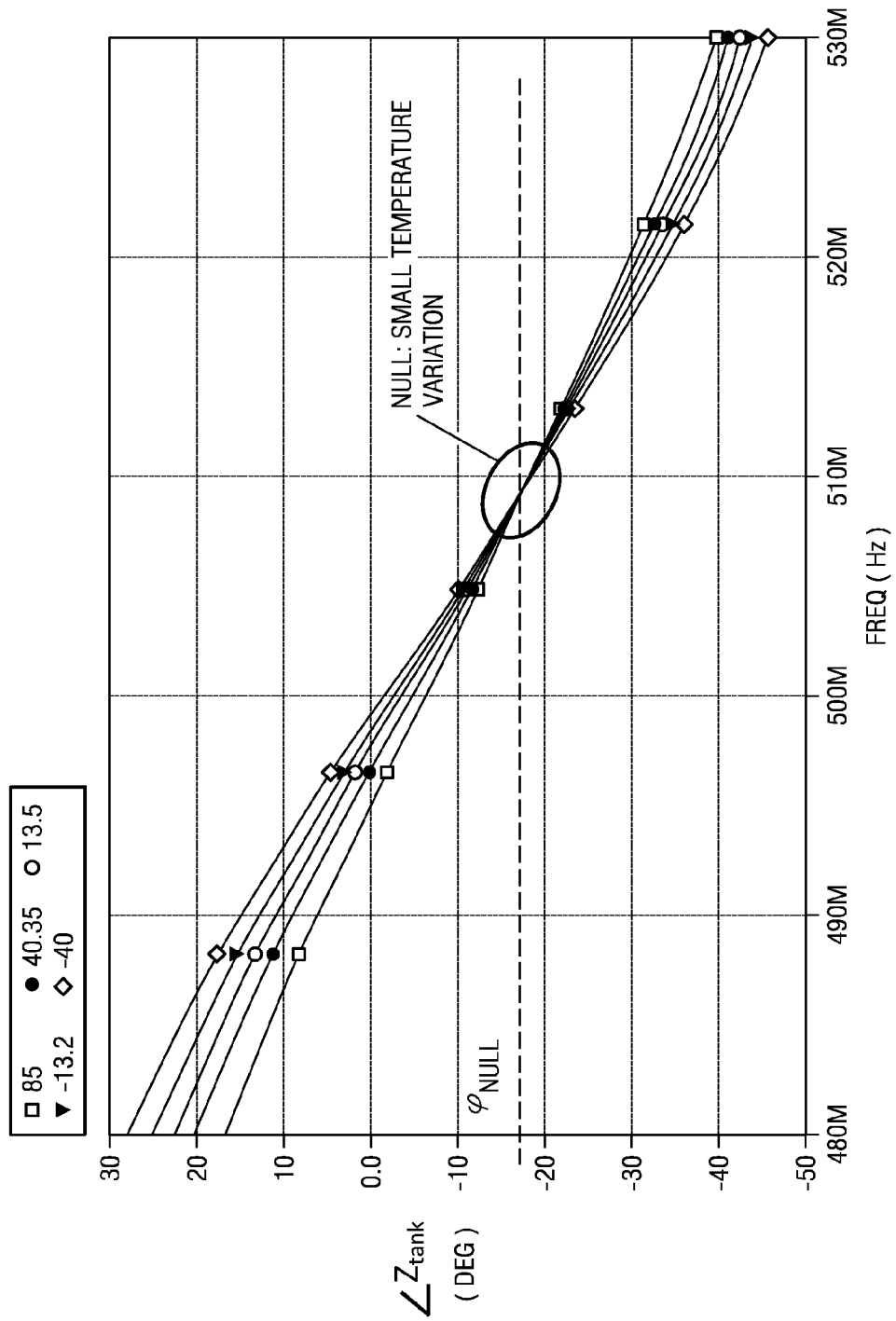
FIG. 4 illustrates a temperature null phase of an exemplary LC oscillator tank in accordance with embodiments of the present invention.

More realistic tanks exhibit a temperature null with small frequency deviations across temperature. This is illustrated graphically in FIG. 4, where the condition of oscillation is $\varphi_{Tank}=\varphi_{Null}$ and the corresponding oscillation frequency across temperature is plotted. As can be seen in FIG. 5, operating the oscillator at the temperature null phase results in an oscillation frequency with a much lower temperature dependence. For example, in FIG. 5, the frequency drift is only 290 ppm. Comparing this to the 8000 ppm frequency drift at zero phase in FIG. 3, oscillating at the temperature null phase produces a more stable frequency.

A Global Temperature Null (GNull) can be defined as a phase operating point $\varphi_{GNull}$ that results in a minimum frequency deviation $\Delta f$ across a temperature range $\Delta T$ with a very small or zero change in oscillation frequency over temperature $df_{osc}/dT$ at the center of the temperature range $T_o$. A measure of the quality of the temperature null is the oscillation frequency deviation across temperature. A Figure of Merit (FOM) of the tank temperature null may be defined as:

$$FOM = \frac{\Delta f}{f_{To} \cdot \Delta T} \text{ ppm/}^\circ \text{C.}, \quad \text{(Equation 5)}$$

where $f_{To}$ is the oscillation frequency at $T_o$. The smaller the value of the FOM the better the null quality and the perfect null has FOM=0.

A Local Temperature Null (LNull) can be defined as a phase operating point $\varphi_{LNull}$ with $df_{osc}/dT=0$. Alternatively, LNull can be defined at temperature T as the intersection of the phase plots of temperatures T+δ and T−δ where δ is infinitesimally small.

The GNull oscillation frequency $\omega_{GNull}$ around temperature $T_o$ may be derived by finding the intersection of two phase curves at temperatures $(T_o+\Delta T)$ and $(T_o-\Delta T)$. For an LC oscillator tank with a linear temperature dependence of $r_L$ the phase and frequency at the GNull are as follows:

$$\omega_{GNull} = \omega_o \cdot \sqrt{1 + \frac{C}{L} r_o^2 (1 - \alpha^2 \Delta T^2)} \quad \text{(Equation 6)}$$

and therefore:

$$\phi_{GNull} = -\tan^{-1}(2r_o C \omega_{GNull}) \quad \text{(Equation 7)}$$

From the above equations 6 and 7, it can be seen that $\omega_{GNull} > \omega_o$ and is a weak function of $\Delta T$. Furthermore, $\phi_{LNull}$ is negative and is a very weak function of $\Delta T$ signifying that the LNull at $T_o$ ($\Delta T = 0$) is the center of the GNull with a temperature range of $(2\Delta T)$ such that:

$$\phi_{GNull} = \phi_{LNull}|_{T=T_o} \quad \text{(Equation 8)}$$

Thus, it is possible to locate a GNull using an LNull point in the temperature range of interest.

The FOM of a GNull generally improves as the Q of the tank increases and the temperature coefficient of the inductor ohmic losses, α, decreases. However, it is possible to improve the FOM of a GNull by using a temperature dependent active and/or passive capacitance. For example, referring again to FIG. 1, capacitor C can be a temperature dependent capacitor. The oscillation frequency is dependent on the impedance of the tank with the capacitive part being very effective such that a second order or higher temperature dependence of the capacitor may act to decrease the overall frequency deviation across the temperature range of interest.

Figure 6:
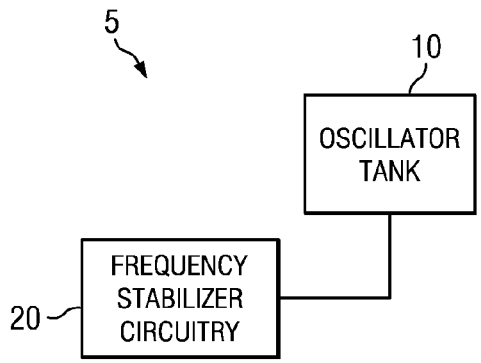
FIG. 6 is a block diagram illustrating an exemplary oscillator having an LC oscillator tank operating at the temperature null phase in accordance with embodiments of the present invention.

Referring now to FIG. 6, classically, LC oscillators 5 have been designed to operate with very close to zero phase across the LC oscillator tank 10, thus usually missing the temperature null. In order to satisfy the Barkhausen criterion, as shown in FIG. 6, in accordance with embodiments of the present invention, a frequency stabilizer circuitry 20 can be used to enable the LC oscillator 5 to oscillate at zero open loop phase, while the LC oscillator tank 10 oscillates at the temperature null phase. For example, in one embodiment, the frequency stabilizer circuitry 20 can be included within the LC oscillator tank 10 to move the temperature null phase to near zero. In other embodiments, the frequency stabilizer circuitry 20 can cause the LC oscillator tank 10 to oscillate at a non-zero value of the temperature null phase, while providing an equal and opposite phase to the temperature null phase to enable the LC oscillator 5 to effectively oscillate at zero open loop phase, thus satisfying the Barkhausen criterion. The frequency stabilizer circuitry 20 can also include a controller that operates to set the phase of the LC oscillator tank to the temperature null phase during calibration/trimming operations and/or during real-time operations. Various embodiments of the LC oscillator tank 10 and frequency stabilizer circuitry 20 will be described below in connection with FIGS. 8 and 10-15.

Figure 7:
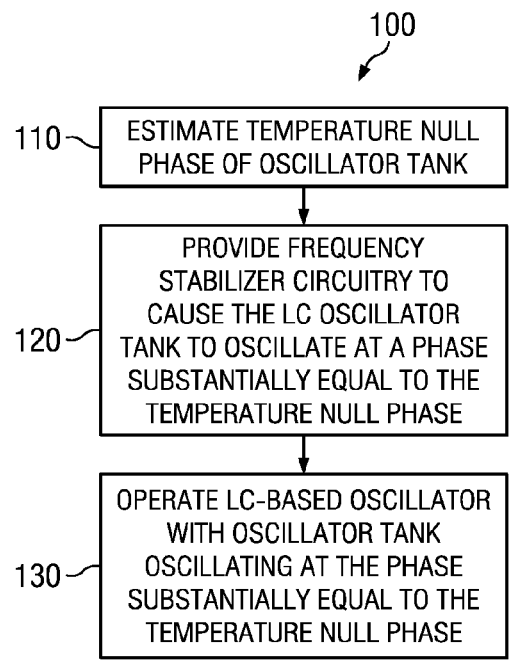
FIG. 7 is a flow diagram illustrating an exemplary method for operating an LC-based oscillator in accordance with embodiments of the present invention.

FIG. 7 is a flow diagram illustrating an exemplary method 100 for operating a temperature-independent LC-based oscillator in accordance with embodiments of the present invention. At block 110, the LC oscillator tank is provided and its temperature null phase is estimated. The temperature null phase is the phase at which variations of frequency with temperature changes are minimal. At block 120, frequency stabilizer circuitry is provided to cause the LC oscillator tank to oscillate at a phase substantially equal to the temperature null phase such that the oscillator has a zero open loop phase, while at block 130, the LC-based oscillator is operated with the LC oscillator tank oscillating at the phase substantially equal to the temperature null phase. For example, in one embodiment, the LC-based oscillator can be trimmed to select the phase that is substantially equal to the temperature null phase to produce a substantially temperature-independent oscillation frequency across a specific temperature range.

Figure 8:
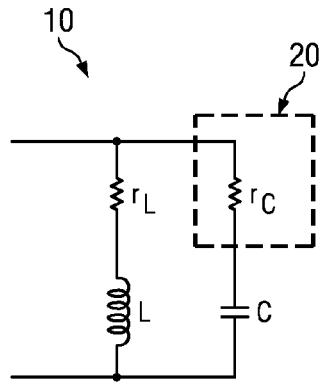
FIG. 8 is a circuit diagram illustrating an exemplary LC oscillator tank operating at the temperature null phase in accordance with embodiments of the present invention.

Referring now to FIG. 8, in order to use classical oscillator implementations and benefit from the temperature null, the LC oscillator tank 10 can be designed to have a $\phi_{GNull} \sim 0$. This can be achieved by having the quality factor of the inductor $Q_L$ and the quality factor of the capacitor $Q_C$ equal across the temperature range of interest. As shown in FIG. 8, a series resistance $r_C$ is added as the frequency stabilizer circuitry to the LC oscillator tank 10 to cause the inductor L and capacitor C to both have finite quality factors. Assuming that the series resistors $r_L$ and $r_C$ are both temperature dependent, the oscillation frequency using a phase condition of $\phi_{Tank} = 0$ results in:

$$\omega_{osc} = \omega_o \cdot \sqrt{\frac{1 - 1/Q_L^2}{1 - 1/Q_C^2}}, \quad \text{(Equation 9)}$$

where:

$$Q_L = \frac{\omega_{osc} L}{r_L}, \quad Q_C = \frac{1}{\omega_{osc} C r_C}. \quad \text{(Equation 10)}$$

In the case where C and L are temperature independent, examining the above equations reveals that if $Q_L$ and $Q_C$ are equal across the temperature range of interest, then the oscillation frequency, at zero phase, will simply be the natural frequency of the LC oscillator tank 10 and independent of temperature. This is equivalent to moving the temperature null (GNull) to the zero phase. In order to achieve this, $r_C$ is selected to satisfy $Q_L \approx Q_C$. If $Q_L = Q_C$, a temperature null at zero phase is attained with $r_L = r_C$. If C and/or L are temperature dependent, then a value for $r_C$ is selected to result in a GNull around zero phase.

Figure 9:
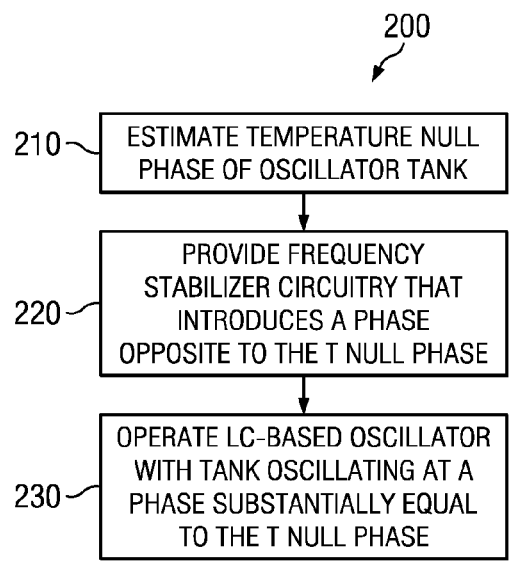
FIG. 9 is a flow diagram illustrating a method for operating an LC-based oscillator at a non-zero phase in accordance with embodiments of the present invention.

FIG. 9 is a flow diagram illustrating a method 200 for operating an LC-based oscillator at a non-zero phase in accordance with embodiments of the present invention. In FIG. 9, once the temperature null phase of the LC oscillator tank is estimated at block 210, frequency stabilizer circuitry is provided within the LC oscillator that introduces in the oscillator open loop transfer function a phase opposite to the estimated temperature null phase of the LC oscillator tank at block 220. Then, at block 230, the LC-based oscillator is operated such that the LC oscillator tank oscillates at the temperature null phase without violating the Barkhausen phase criterion of zero open loop phase. For example, an amplifier within the LC-based oscillator can be designed to provide, at steady state, a phase equal to $-\phi_{GNull}$ (negative of the Global Null Phase) for a zero open loop phase of the oscillator.

Figure 10:
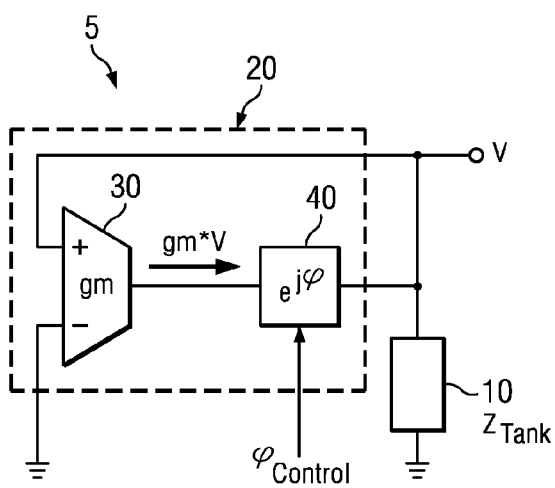
FIG. 10 is a diagram illustrating an exemplary oscillator designed to operate the LC oscillator tank at the temperature null phase in accordance with embodiments of the present invention.

FIG. 10 is a diagram illustrating an exemplary LC-based oscillator 5 designed to operate the LC oscillator tank 10 at the temperature null phase in accordance with embodiments of the present invention. As mentioned above, operating at the temperature null phase results in a very high stability oscillator 5 across temperature. In order to implement an oscillator 5 that operates at the temperature null, a frequency stabilizer circuitry 20 is provided that enables the LC oscillator 5 to oscillate at zero open loop phase, while the LC oscillator tank 10 oscillates at the temperature null phase.

The frequency stabilizer circuitry 20 includes an amplifier (gm transconductor) 30 and phase shift circuitry ("$e^{j\Phi}$" block) 40. The amplifier 30, in combination with the phase shift circuitry 40, is designed at steady state to provide a phase equal to the negative of GNull ($-\phi_{GNull}$). In addition, the amplifier 30 and phase shift circuitry 40 are designed such that the phase generated has a low temperature dependence.

In an exemplary operation, the phase shift circuitry 40 shifts the phase of the output of the amplifier 30, which causes the LC oscillator tank 10 to oscillate with a non-zero phase at or near the tank's temperature null phase. For example, if the amplifier has sufficient gain, the LC oscillator tank 10 will oscillate at a frequency where the phase across the LC oscillator tank 10 is equal and opposite to the phase produced by the phase shift circuitry 40.

The phase shift circuitry 40 allows the precise generation of such a phase and the ability to control the phase magnitude in order to be as close as possible to the optimum phase operating point, via phase control signal $\phi_{Control}$. Phase control signal $\phi_{Control}$ can be used to set a fixed phase operating point, during calibration/trimming operations to tune the phase operating point and/or during real-time operations (i.e., while a device incorporating the oscillator 5 is in use by a user) to fine tune the phase operating point. For example, a controller/processor can measure the output of the oscillator 5 and generate the phase control signal $\phi_{Control}$ in response thereto. The accuracy of the phase control will determine how close the final phase operating point will be to the Global Null.

Thus, as shown in FIG. 10, the active circuitry (gm transconductor 30 and phase shift circuitry 40) provides an equal and opposite phase such that the tank impedance at oscillation frequency is:

$$Z_{Tank} = \frac{1}{g_m} e^{-j\varphi} \qquad \text{(Equation 11)}$$

Therefore, if the phase shift $\phi$ is close to the tank's $\phi_{Null}$, operation with an almost temperature independent frequency is achieved. The phase shift circuitry 40 can be implemented using active and/or passive phase shifters with the ability to control the phase in order to tune the oscillator to work as close as possible to the temperature null.

Figure 11:
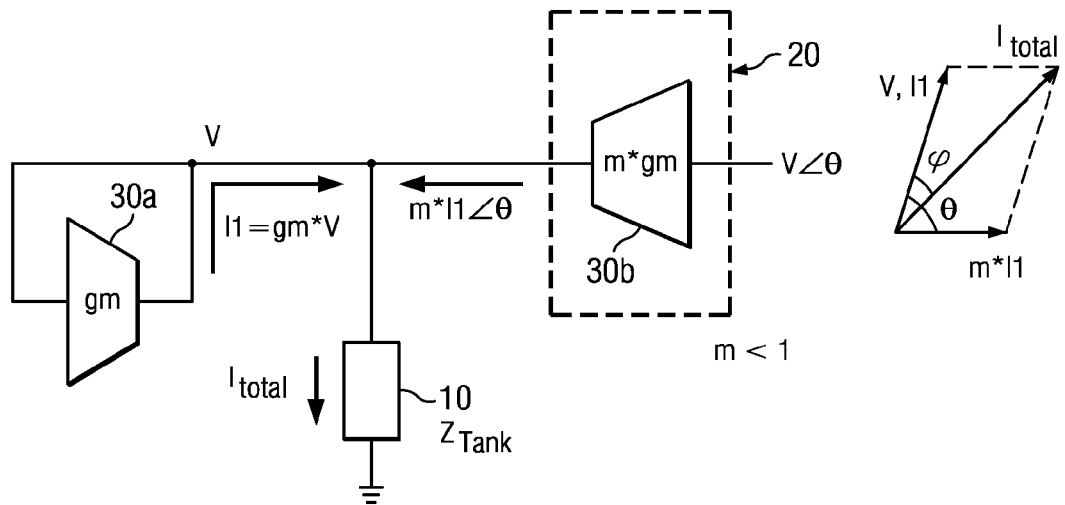
FIG. 11 is a diagram illustrating another exemplary oscillator designed to operate the LC oscillator tank at the temperature null phase in accordance with embodiments of the present invention.

FIG. 11 is a diagram illustrating another exemplary oscillator 5 designed to operate the LC oscillator tank at the temperature null phase in accordance with embodiments of the present invention. In the design of FIG. 11, two unequal currents (with ratio=m) having some phase shift $\theta$ are injected into the tank 10 to produce an overall current $I_{total}$ with a phase shift depending on the two components' ratio (m). The combined phase shift $\phi$ of $I_{total}$ causes the LC oscillator tank 10 to oscillate at a non-zero phase. The ratio (m) and phase shift $\theta$ are selected to cause the LC oscillator tank 10 to oscillate with at or near the tank's temperature null phase.

For example, as shown in FIG. 11, a first amplifier (gm transconductor) 30a injects a current I1 into the tank 10, while a second amplifier (m*gm transconductor) 30b, forming the frequency stabilizer circuitry 20, injects a second current m*I1∠θ into the tank 10. The resulting phase produced in the LC oscillator tank 10 is a function of the ratio (m) of I1 and I2 and the phase of I2 (θ). For example, if m=1 and θ=90 degrees, the resulting phase of the current through the LC oscillator tank would be −45 degrees. Therefore, to produce a phase shift of magnitude less than 45 degrees, the ratio (m) is typically less than 1 and the phase shift θ may be less than 90 degrees.

The voltage (V∠θ) coupled to amplifier 30b can be generated using any technique that is weakly temperature dependent. For example, multiple coupled oscillators, i.e., "N" identical oscillators, designed to generate multiple phases can produce the desired voltage (V∠θ). As an example, the use of quadrature phase (θ=90°) where only two oscillators are needed can be used to produce the desired voltage.

Figure 12:
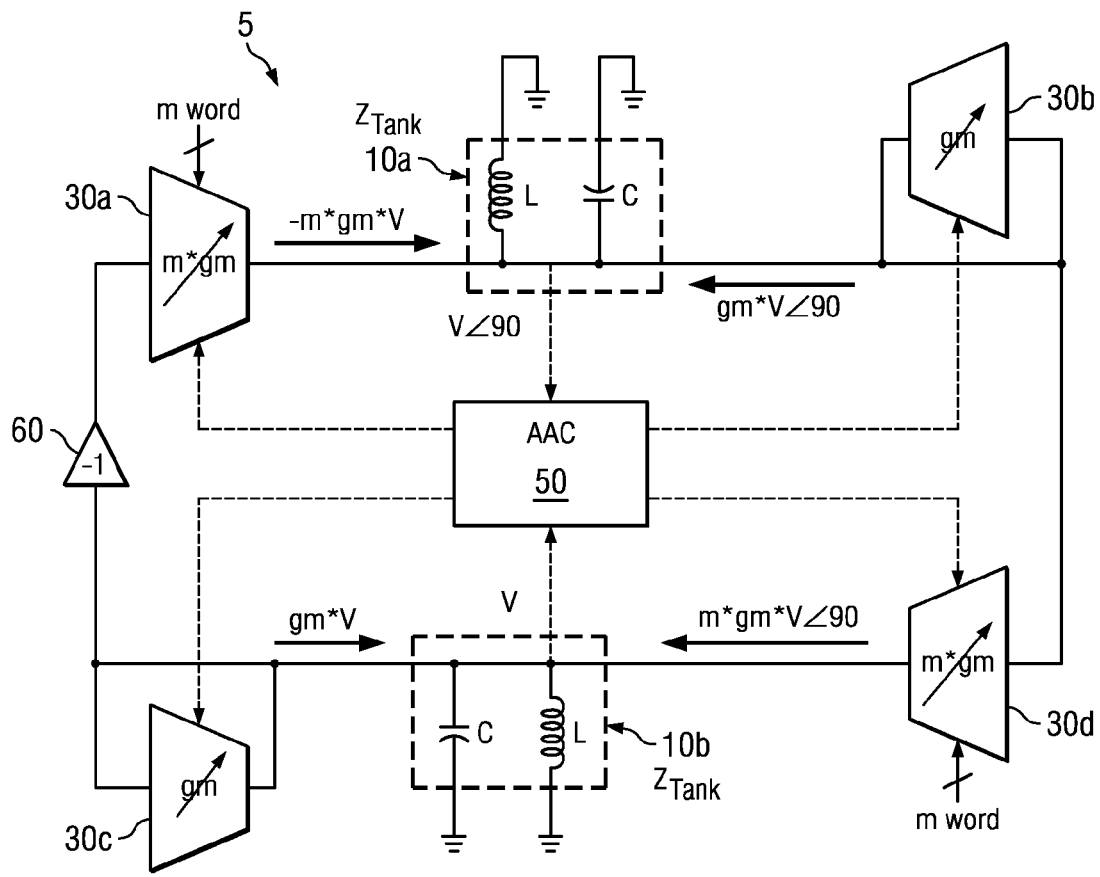
FIG. 12 is a diagram illustrating an exemplary oscillator designed to operate with minimal temperature dependence in accordance with embodiments of the present invention.

One embodiment using quadrature phase is shown in FIG. 12. In FIG. 12, the oscillator 5 includes two nearly identical oscillator tanks 10a and 10b oscillating in quadrature with respect to one another. Amplifiers 30b and 30c produce nearly the same transconductance ($g_m$), while amplifiers 30a and 30d produce respective phase shifted transconductances (m*$g_m$) to the tanks 10a and 10b. A gain block 60 produces a phase shift of 180 degrees to force the two tanks 10a and 10b to be 90 degrees out of phase with one another. Therefore, the total phase shift $\phi$ across each tank 10a and 10b is simply a function of the coupling ratio m and is given by:

$$\tan(\phi) = m \qquad \text{(Equation 12)}$$

An automatic amplitude control (AAC) block 50 senses the operating amplitude of the outputs V and V∠90 of the oscillator 5, and continuously adjusts the loop gain to be exactly unity, while the amplifiers 30a-30d are operating in their linear regime, as will be described in more detail below in connection with FIG. 13.

Varying the ratio m may be done by either scaling the biasing current of the coupling amplifiers 30a and 30b and/or scaling the active devices (for example MOS transistor differential pair) dimensions within the amplifiers 30a and 30d. For example, varying the ratio m may be done by switching off/on devices within amplifiers 30a and 30d, while maintaining low performance mismatch and a stable temperature independent coupling ratio across temperature, which in turn produces a constant phase across the two tanks 10a and 10b. The setting of the ratio m may be done during the trimming of the oscillator and can then be kept fixed during the operation of the oscillator. This may be achieved using analog or digital techniques. For example, a digital word representing the required ratio setting m may be stored on chip using a non-volatile memory to be available for future use during the lifetime of the oscillator. It should be noted that the AAC block 50 should control all transconductance amplifiers 30a-30d to ensure that all four amplifiers have tracking gain, and therefore, the effective coupling ratio m remains constant during operation.

The two main sources of temperature dependence that affect the null are: (1) parasitic impedances of active circuitry that are temperature dependent; and (2) harmonic content of the currents in the tank 10. The parasitic capacitance, linear or nonlinear, of active circuitry may cause frequency shifts with temperature, supply and output voltage swing. Furthermore, the amplifier 30 output resistance may reduce the tank effective quality factor, thus reducing the tank's FOM. The effect of parasitics can be minimized by careful design of the oscillator 5. For example, the tank 10 capacitance can be designed to be much larger than active circuitry parasitic capacitances to ensure that the temperature dependence of the tank capacitance is dominant and any parasitic capacitances have a very small impact on the temperature null position and quality. In addition, the output resistance can be designed to be as high as possible in order to avoid decreasing the quality factor of the tank 10, which in turn can degrade the quality of the null as well as changing its position.

Since any oscillator by definition has a positive feedback loop, the oscillation amplitude in a classical oscillator with sufficient gain will increase until the amplifier nonlinearities limit the amplitude growth. At steady state, the oscillator output contains many harmonics such that the large signal gain is unity, thus the amplitude is constant. However, any nonlinearity in the active circuitry will inject harmonics into the tank 10, causing an energy imbalance between the capacitor and the inductor, thus lowering the oscillation frequency to restore balance as given by:

$$\omega = \omega_{os}\left(1 - \frac{1}{2Q^2}\sum_{2}^{\infty}\frac{n^2}{n^2-1}\frac{I_n^2}{I_1^2}\right)$$ (Equation 13)

where $\omega_{os}$ is the oscillation frequency without harmonics and $I_n$ is the $n^{th}$ harmonic of the current in the tank. As the harmonic content injected into the tank is temperature, supply and oscillation amplitude dependent, the oscillation frequency will also vary. The effect of harmonics can be minimized by making the oscillator work at the critical gain condition of oscillation, thus preventing any excess gain from growing the oscillation amplitude to levels exceeding the amplifier linear region, thus an oscillation with a very low harmonic content.

Figure 13:
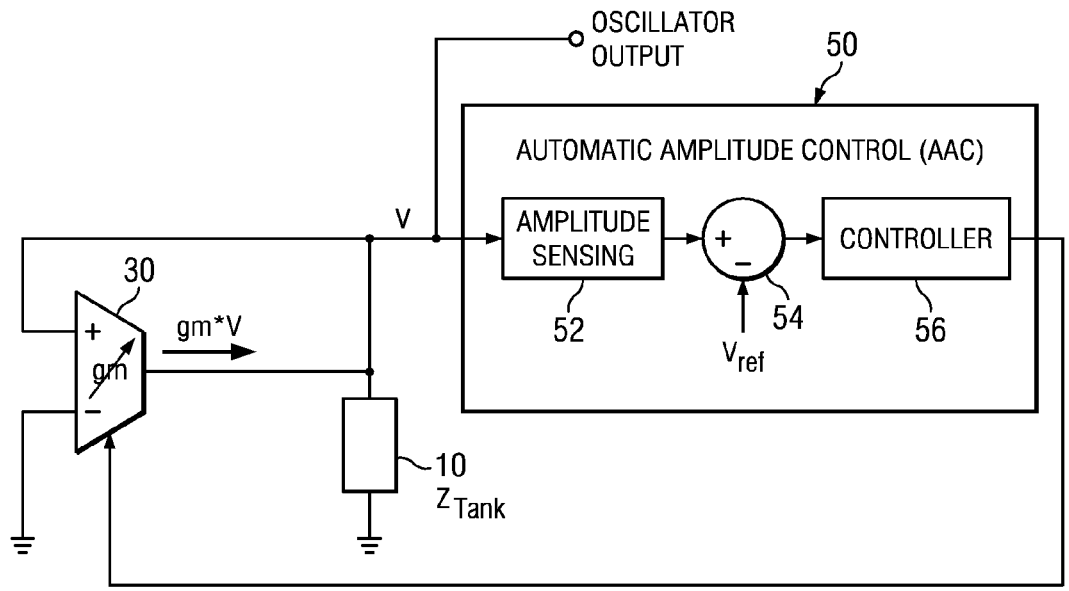
FIG. 13 is a diagram illustrating an exemplary oscillator with an Automatic Amplitude Control (AAC) block accordance with embodiments of the present invention.

Turning now to FIG. 13, there is illustrated an exemplary AAC block 50 designed to continuously adjust the loop gain to be exactly unity, while the amplifier 30 is operating in its linear regime. The AAC block 50 includes amplitude sensing circuitry 52 that measures the amplitude of oscillation, comparison circuitry 54 that compares the sensed amplitude to a reference voltage Vref and a controller 56 that generates a signal to control the gain of the amplifier 30 based on the output of the comparison circuitry 54. At steady state, the oscillation amplitude should be less than the linear region limit of the amplifier 30 and equal to a scaled value of the reference voltage, while the gain of the amplifier 30 is set to operate at the critical gain condition of oscillation.

Figure 14:
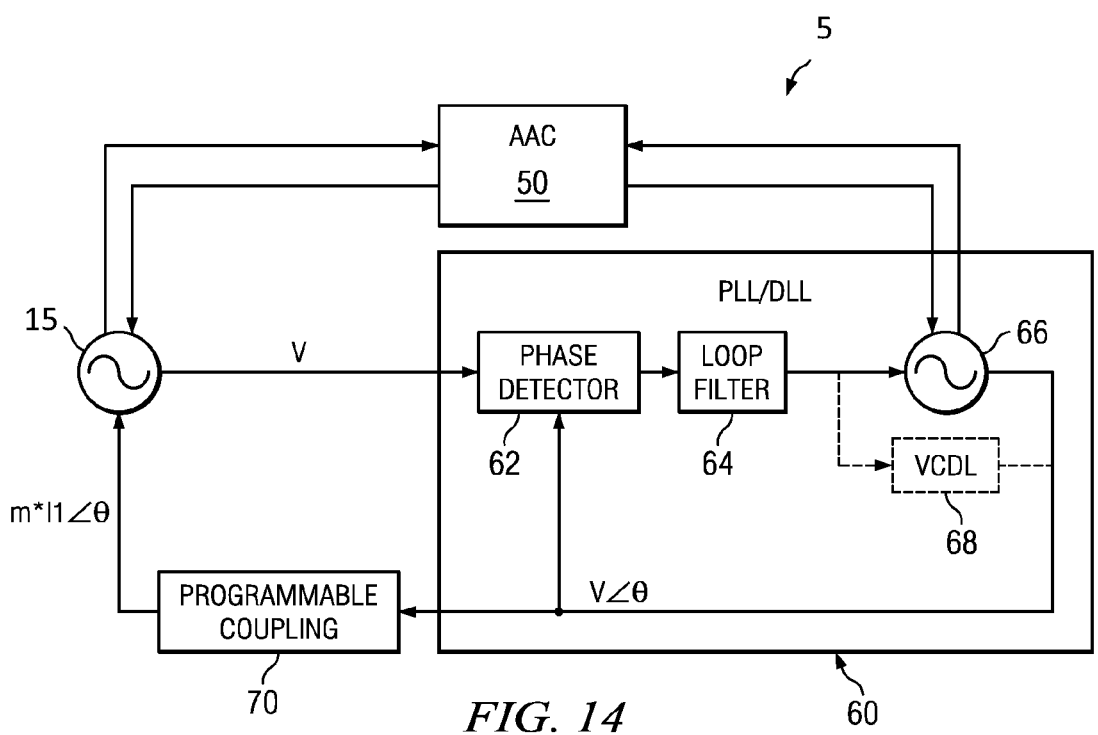
FIG. 14 is a diagram illustrating still another exemplary oscillator designed to operate the LC oscillator tank at the temperature null phase in accordance with embodiments of the present invention.

FIG. 14 illustrates an oscillator system 5 designed to operate the LC oscillator tank at the temperature null phase in accordance with embodiments of the present invention. The oscillator system 5 in FIG. 14 includes a Phase-Locked Loop (PLL) or a Delay-Locked Loop (DLL) 60 with a phase detector 62 that generates zero phase error output when its inputs are shifted by a constant phase θ. For example, the phase detector 62 can be an XOR gate or a mixer (for an analog implementation), which at steady state will have its inputs in quadrature i.e. θ=90°.

The PLL/DLL 60 further includes a loop filter 64 and either a PLL voltage controlled oscillator (VCO) 66 (when operating as a PLL) or a Voltage Controlled Delay Line (VCDL) 68 (when operating as a DLL). When operating as a PLL, the output of the reference oscillator 15 (V) is input to the phase detector 62 to enable the PLL 60 to lock the phase of the PLL VCO 66 to the reference oscillator 15, such that at steady state, the PLL VCO 66 and reference oscillator 15 have the same frequency and are shifted in phase by θ. Thus, the PLL 60 forces the PLL VCO 66 to track the frequency of the reference oscillator 15, and therefore, the two oscillators 15 and 66 always have the same frequency even if they do not have the same tank. When operating as a DLL, the phase relationship between the oscillator 15 and the DLL 60 is achieved using the VCDL 66.

The output V∠θ of the PLL VCO 66 or VCDL 68 is input as a feedback signal to the phase detector 62 and is also input to a programmable coupling circuit 70. The programmable coupling circuit 70 couples a fraction of the PLL/DLL output V∠θ, shown as m*I1∠θ, to the reference oscillator 15 to enable the reference oscillator 15 to operate at the temperature null. An AAC block 50 is also coupled to the oscillators 15 and 66 in order to maintain the coupling ratio m between the two oscillators 15 and 66 constant over temperature. As such, the reference oscillator 15 may operate at the required temperature null phase and have a low temperature dependence.

Figure 15A:
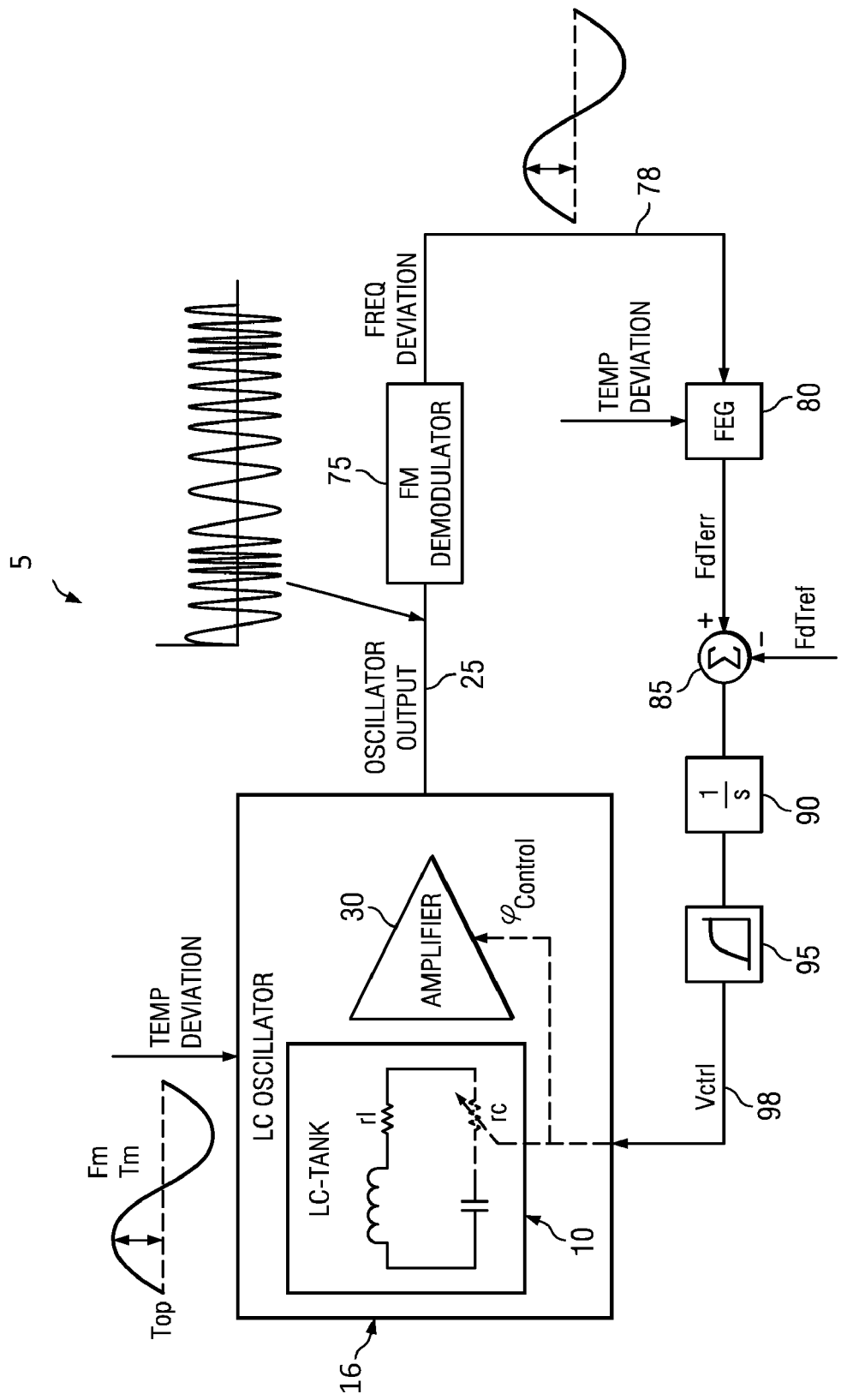
FIG. 15A is a diagram illustrating a feedback aided oscillator designed to operate the LC oscillator tank at the temperature null phase in accordance with embodiments of the present invention.

FIG. 15A illustrates a feedback aided oscillator 16 designed to operate the LC oscillator tank 10 at the temperature null phase in accordance with embodiments of the present invention. An oscillator system 5, shown in FIG. 15A, tunes the LC-tank 10, as shown in FIG. 8, and/or the active circuitry (i.e., amplifier 30 in combination with phase shift circuitry 40), as shown in FIG. 10, of the oscillator 16 to adjust the tank phase shift to the temperature null phase.

The oscillator system 5 automates the operation at the GNull using a feedback control loop that stabilizes when the oscillator is in a specific state of sensitivity to temperature. A temperature excitation signal superimposed on the operating temperature is applied to the oscillator 16. For example, the temperature excitation signal may be sinusoidal with a frequency $f_m$ having an amplitude $T_m$ and superimposed over an operating temperature $T_{op}$. If the oscillator 16 is sensitive to temperature, the oscillation 25 output from the oscillator 16 will change as the temperature associated with the temperature excitation signal changes, resulting in an oscillation 25 that is frequency modulated by $f_m$.

The output 25 of the oscillator 16 is input to an FM demodulator 75, which senses the frequency of oscillation deviation. A Frequency Error Generator (FEG) 80 converts the output (Freq Deviation) 78 of the FM demodulator 75 and the temperature variation into an error signal $FdT_{err}$ proportional to the sensitivity of the oscillation frequency to temperature ($\Delta f_{osc}/\Delta T$). The error signal ($FdT_{err}$) and a reference signal ($FdT_{ref}$) are compared at comparison block 85 and the resultant is integrated at integrator 90 and then low pass filtered by low pass filter 95. The final control signal ($V_{ctrl}$) 98 is then used to control the oscillator 16 operation to allow the LC-tank 10 to operate at the temperature null phase or to shift the null to zero phase through direct control of the phase shift or by controlling $r_C$ respectively.

Figure 15B:
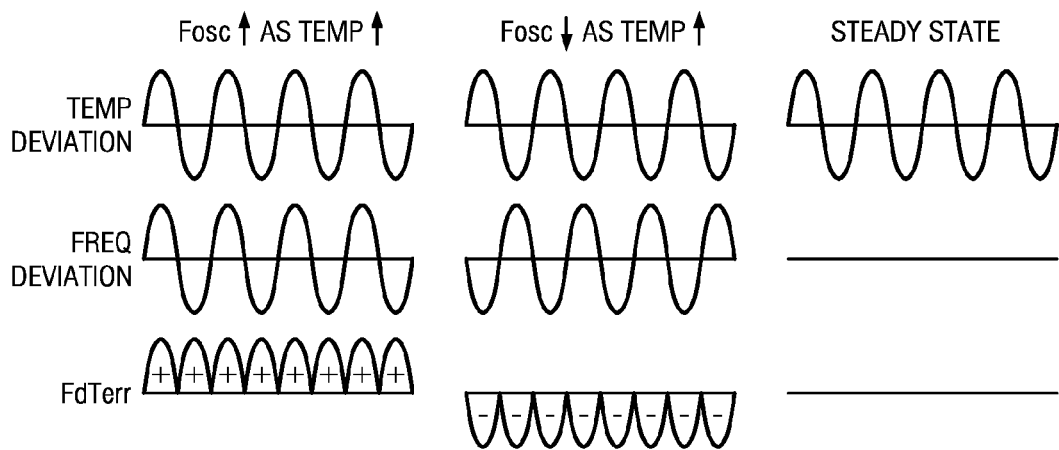
FIG. 15B is a diagram illustrating an exemplary design of a frequency error generator for use within the feedback aided oscillator of FIG. 15A in accordance with embodiments of the present invention.
Figure 15B:
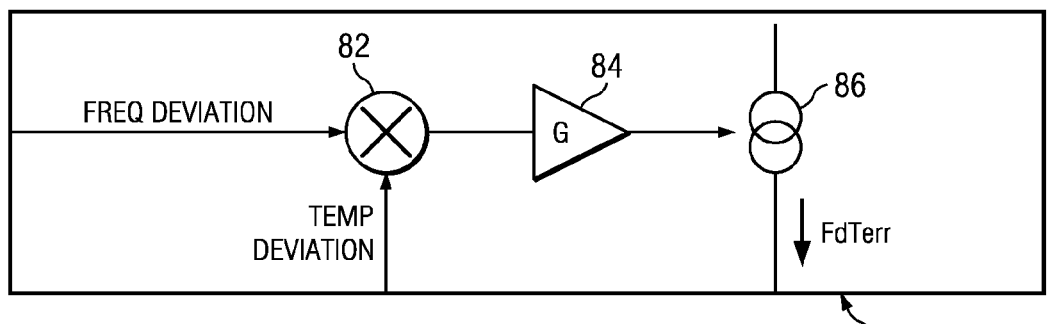

An example of the implementation of the FEG 80 is shown in FIG. 15B. The FEG 80 includes a mixer 82, a gain stage 84 and a transconductor 86. The mixer 82 takes as input the output of the FM Demodulator (Freq Deviation) and the temperature excitation signal (Temp Deviation) and generate an error signal ($FdT_{err}$) with an average value proportional to $\Delta f_{osc}/\Delta T$. The generated error signal ($FdT_{err}$) has a positive average value for positive frequency deviations with increasing temperature and reverses sign with negative frequency deviations, as can be seen in the frequency plots of FIG. 15B.

Figure 15C:
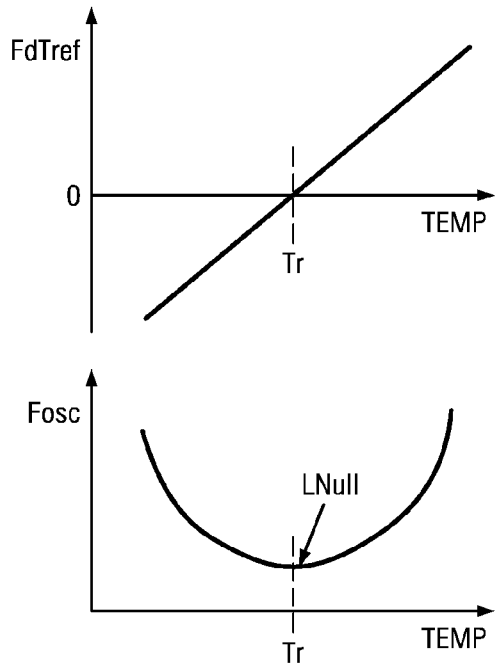
FIG. 15C illustrates the stabilization point of the feedback aided oscillator of FIG. 15A in accordance with embodiments of the present invention.

At steady state, the error signal $Fet_{ter}$ has an average value equal to the reference $FdT_{ref}$. If the reference signal is zero, then the feedback loop reaches steady state when the error signal has a zero average. This is equivalent to tuning the oscillator 16 to operate at the LNull of the operating temperature, since a zero error signal is equivalent to $\Delta f_{osc}/\Delta T=0$. If the reference signal is designed to be a function of temperature with a zero value at a reference temperature $T_{ry}$ as shown in FIG. 15C, the loop stabilizes when:

$$\frac{\Delta f_{osc}}{\Delta T} = \beta \cdot FdT_{ref}$$ (Equation 14)

Overall, the loop is designed such that the oscillator operates at the GNull that has an LNull at temperature $T_r$. The constant β is dependent on the loop gain and the target oscillation frequency tolerance with temperature.

Figure 15D:
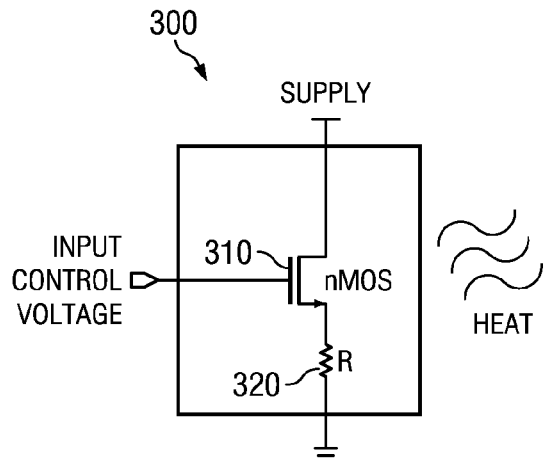
FIG. 15D is a circuit diagram illustrating an exemplary heater circuit for use within the feedback aided oscillator of FIG. 15A in accordance with embodiments of the present invention.
Figure 15E:
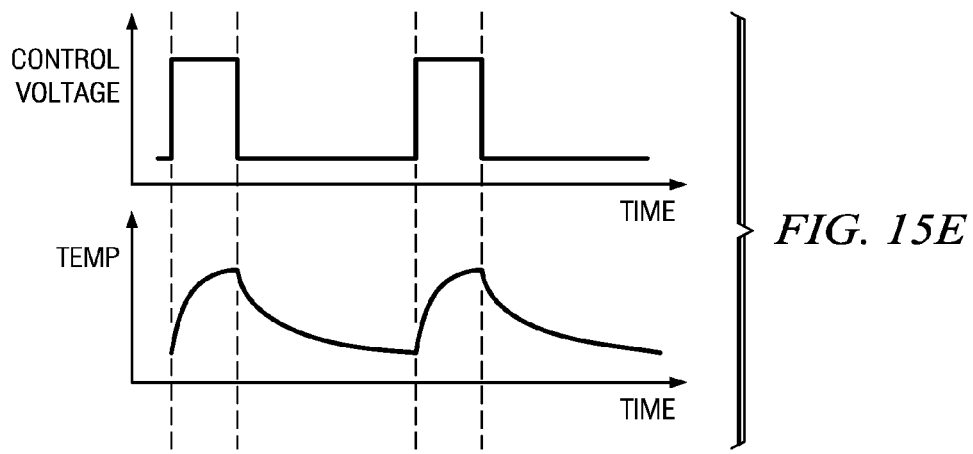
FIG. 15E illustrates an exemplary temperature signal emitted from the heater circuit shown in FIG. 15D in accordance with embodiments of the present invention.

Turning now to FIGS. 15D and 15E, in order to modulate the temperature of the oscillator, integrated voltage controlled heating elements 300 may be used that are capable of locally heating the oscillator 5. An example of a heating element is shown in FIG. 15D. The heating element 300 includes an NMOS transistor 310 and an integrated polysilicon resistor 320. The input control voltage may be a rail to rail signal at the desired modulation frequency and the duty cycle of the input signal can be varied to control the amplitude to temperature modulation Tm, as shown in FIG. 15E. It may also be possible to control the temperature by varying the amplitude of the input square wave.

The heating elements 300 can be distributed on the chip so that almost all devices of the oscillator system have the same temperature, and thus the overall oscillator temperature may be controlled. The heating elements 300 can be placed and wired so that, as much as possible, all connecting wires are perpendicular to field lines and away from sensitive circuit nodes and signals to avoid undesired electrical coupling.

Not all LC-tanks have a deterministic temperature null phase due to manufacturing process variations of the oscillator components, resulting in a variation of the temperature null phase. Therefore, trimming techniques may be needed to operate the LC-Tank oscillator substantially close to the temperature null phase. The lower the desired oscillation frequency variation with temperature (better frequency stability), the closer the phase operation of the LC oscillator tank to the temperature null phase should be, and in turn, the more expensive the trimming may be. In order to decrease the cost of trimming, the number and complexity of measurements should be minimized, as well as the number of temperatures the measurements are performed at. The ability to trim the oscillator at room temperature only using few measurements or to design the LC-tank oscillator to require minimum trimming may be of significant economical value.

Figure 16A:
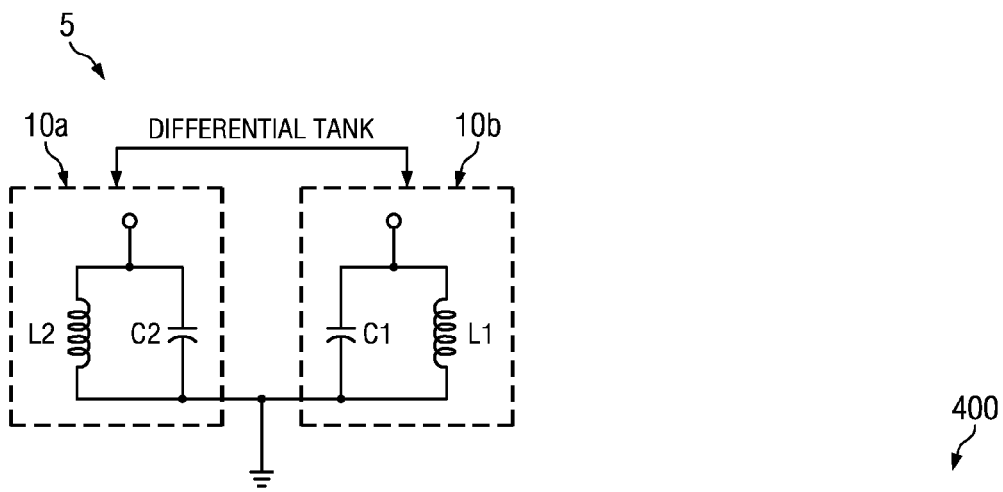
FIG. 16A is a circuit diagram illustrating an exemplary differential LC oscillator tank for producing an extended temperature null phase range in accordance with embodiments of the present invention.
Figure 16B:
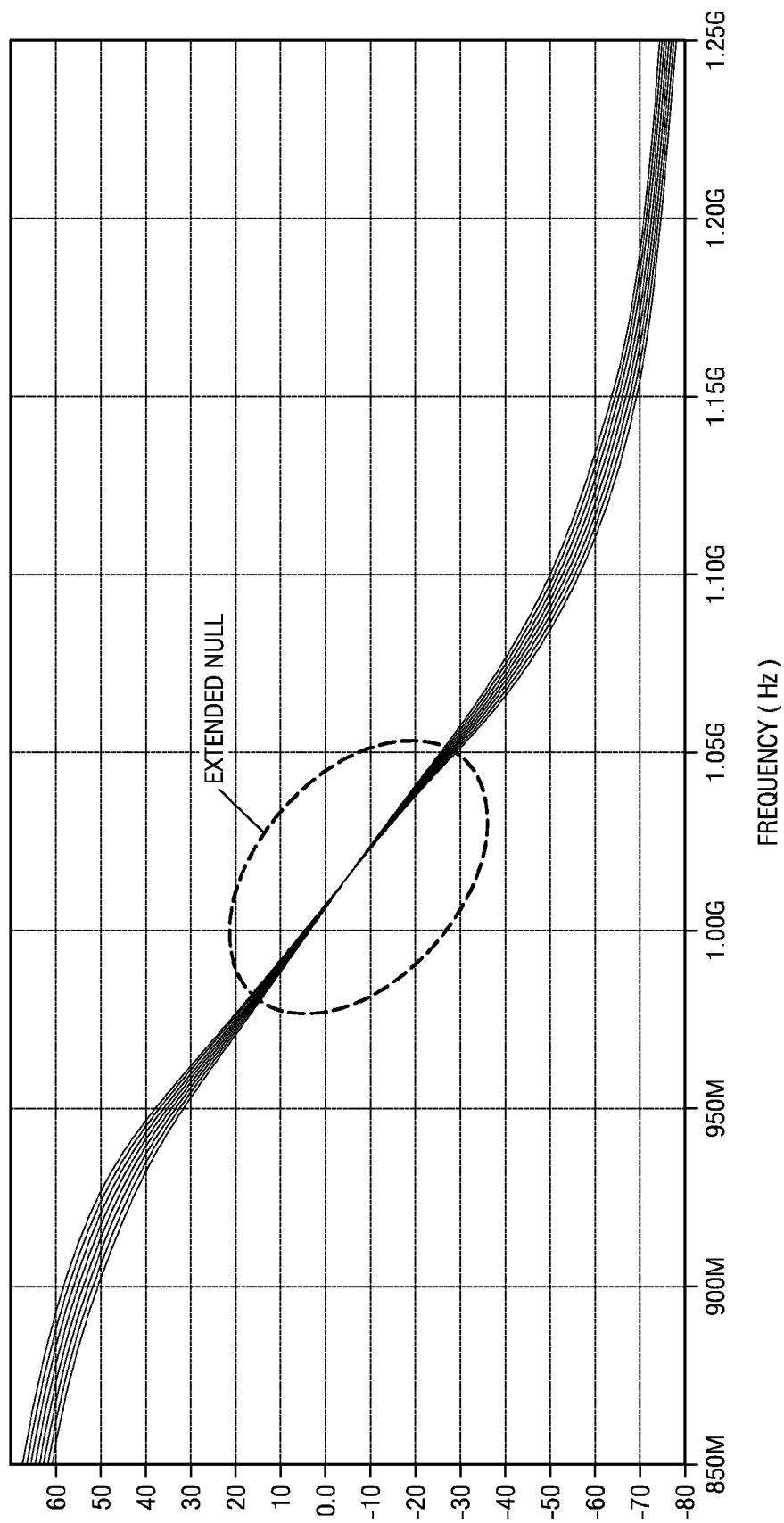
FIG. 16B illustrates an exemplary extended temperature null phase range produced by the differential LC oscillator tank of FIG. 16A in accordance with embodiments of the present invention.

Referring now to FIG. 16A, a differential tank 10 that uses an intentionally mismatched pair of tanks 10a and 10b in a differential oscillator is shown. For example, values of L1/C1 and L2/C2 can be chosen such that the resonance frequency of L1/C1 in tank 10b is slightly different than the resonance frequency of L2/C2 in tank 10a. Such a tank 10 design showed an extended temperature null over a range of phases rather than a single phase, as shown in FIG. 16B. The differential tank 10 design can be used in any of the above mentioned oscillator designs, as shown in FIGS. 8 and 10-15, to operate within the phase range that will result in low temperature dependence covering manufacturing process variations.

As mentioned above, using any of the oscillator designs shown in FIGS. 8 and 10-15, once the oscillator is operating at the tank's temperature null, almost temperature independent oscillation frequency can be achieved. However, the null position may shift due to process variation. If this shift causes an acceptable temperature variation in frequency, depending on the application, no temperature trimming or calibration will be necessary. In this case, only a room temperature calibration for the adjustment of initial frequency accuracy will be needed.

However, for more demanding applications, where the temperature dependence of oscillation frequency should be minimized, temperature trimming to tune the oscillator to operate at the GNull once again may be needed to assure operation at the tank's temperature null. The trimming procedure length and complexity determines the testing cost of the product, and in turn the overall cost of the final product.

The ability to relate the GNull to an LNull opens the way for low cost trimming, since the oscillator need not be operated at several or many temperatures, which is expensive, to find the GNull. For example, as illustrated in FIGS. 17A and 17B, using two temperature insertions, at each temperature, the phase shift across the tank is varied and the oscillation frequency is observed. Thus, $\phi_{Null}$ will be the phase with minimum frequency difference between two temperatures. Similarly, more than two temperatures or insertions may be used to achieve the required temperature dependence.

Referring now to FIGS. 18A and 18B, any oscillator, including but not limited to LC-Tank based oscillators, crystal-based oscillators, MEMS-based oscillators, ring oscillators and relaxation oscillators, with sensitivity to temperature may be looked at as an oscillator with a temperature control, and thus the output frequency may vary in response to a stimulus to the oscillator's temperature. If the temperature of the oscillator is modulated by a sinusoidal signal with frequency fm and amplitude Tm, as described above in connection with FIG. 15A, then using the Narrow Band Frequency Modulation (NBFM) approximation, it becomes apparent that the spectrum of the oscillator has a side tone at an offset fm from the original oscillator frequency, as shown in FIG. 18B. The magnitude of this side tone is dependent on the modulation amplitude Tm, modulation frequency fm and the oscillator sensitivity to temperature BT. The magnitude of the side tone relative to the oscillation frequency magnitude Sr may be derived using the NBFM approximation as:

$$Sr=Tm*BT/2*fm \qquad \text{(Equation 15)}$$

From the above analysis, the oscillation frequency sensitivity to temperature BT of any oscillator, as defined above, may be estimated by observing the spectral content of the oscillator output. The knowledge of BT variation in response to oscillator parameter(s) at one or more temperatures may be used to select such parameter(s) to operate the oscillator to exhibit certain desirable performance across temperature. The analysis assumes a sinusoidal temperature modulation for ease of analysis and simplicity. However, the temperature modulation profile can assume any shape which may be decomposed or approximated by discrete or a continuum of sinusoids thus make use of the above analysis in estimating the oscillator frequency temperature sensitivity BT.

Therefore, the oscillator can be trimmed, using, for example, the feedback aided design shown in FIG. 15A, to operate at a specific temperature sensitivity, including zero or very close to zero sensitivity at a single temperature To (e.g. room temperature), by modulating the temperature by Tm around To with a frequency fm and measuring Sr. To find the minimum temperature sensitivity of the oscillator, the trimming control can be varied to search for the minimum Sr that would be equivalent to operating the oscillator at minimum temperature sensitivity. For example, the feedback loop shown in FIG. 15A can be used to find the GNull simply by finding the LNull at room temperature, and the values obtained by the loop can be stored in a non-volatile memory for subsequent use.

Figure 19:
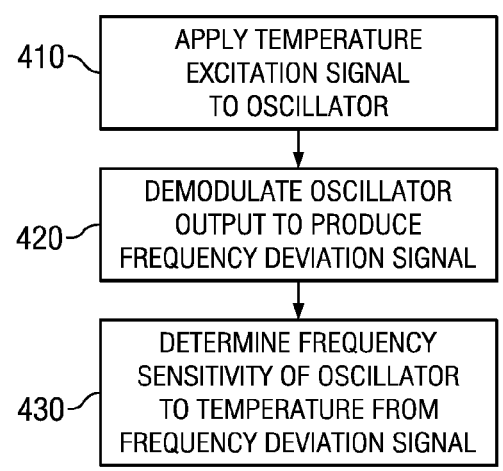
FIG. 19 is a flow diagram illustrating a method for determining the frequency sensitivity of an oscillator to temperature in accordance with embodiments of the present invention.

FIG. 19 is a flow diagram illustrating a method 400 for determining the frequency sensitivity of an oscillator to temperature in accordance with embodiments of the present invention. The method begins at block 410, where a temperature excitation signal is superimposed on an operating temperature of the oscillator. At block 420, an output of the oscillator is demodulated to produce a frequency deviation signal indicative of a frequency deviation produced by the oscillator in response to the temperature excitation signal. Then, at block 430, the frequency sensitivity of the oscillator to temperature is determined. For example, an error signal proportional to the frequency sensitivity of the oscillator to temperature can be produced from the frequency deviation signal and the temperature excitation signal.

Oscillators designed to operate at the temperature null phase in accordance with any of the above embodiments find applications in many domains, such as but not limited to, consumer electronics, industrial equipment, computing devices, system interfaces (e.g., Universal Serial Bus (USB), Serial Advance Technology Attachment (SATA) and Peripheral Component Interconnect (PCI) Express), automotive, medical equipment, avionics, communications systems and various others. In addition, oscillators designed to operate at the temperature null phase in accordance with any of the above embodiments can be stand-alone low-temperature sensitivity oscillators, drop-in oscillators in system-on-chips (SoC) and/or included within FPGA chips that are user programmable.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "coupled to" and/or "coupling" and/or includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, phase, and/or power level. As may further be used herein, inferred coupling (i.e., where one element is coupled to another element by inference) includes direct and indirect coupling between two items in the same manner as "coupled to". As may even further be used herein, the term "operable to" indicates that an item includes one or more of power connections, input(s), output(s), etc., to perform one or more its corresponding functions and may further include inferred coupling to one or more other items. As may still further be used herein, the term "associated with", includes direct and/or indirect coupling of separate items and/or one item being embedded within another item.

As will be recognized by those skilled in the art, the innovative concepts described in the present application can be modified and varied over a wide range of applications. Accordingly, the scope of patents subject matter should not be limited to any of the specific exemplary teachings discussed, but is instead defined by the following claims.

We claim:

1. An oscillator system, comprising: an LC oscillator tank operable to generate a tank oscillation at a phase substantially equal to a temperature null phase, the temperature null phase being a phase at which variations in frequency of an output oscillation of the oscillator system with temperature changes are minimized; an amplifier coupled in a feedback loop with the LC oscillator tank; and frequency stabilizer circuitry coupled to the LC oscillator tank and operable to cause the LC oscillator tank to oscillate at the phase substantially equal to the temperature null phase such that the output oscillation of the oscillator system has a substantially zero open loop phase.

2. The oscillator system of claim 1, wherein: the temperature null phase is substantially equal to zero; the LC oscillator tank includes: an inductive element; a capacitive element coupled in parallel with the inductive element; an inductive resistor coupled in series with the inductive element; and a capacitive resistor coupled in series with the capacitor, said capacitive resistor forming the frequency stabilizer circuitry; and a value of said capacitive resistor is selected to enable a quality factor of the inductive element and a quality factor of the capacitive element to be substantially equal across a temperature range of interest.

3. The oscillator system of claim 1, wherein the LC oscillator tank further includes a capacitance having at least a second order temperature dependence to decrease a frequency deviation of the LC oscillator tank across a temperature range of interest, the capacitance including at least one of an active capacitance and a passive capacitance.

4. The oscillator system of claim 1, wherein the frequency stabilizer circuitry further includes: phase shift circuitry coupled to the LC oscillator tank and to the amplifier that operates to produce a phase substantially equal to a negative of the temperature null phase based on a phase control signal.

5. The oscillator system of claim 1, further comprising: automatic amplitude control circuitry coupled to the LC oscillator tank and the amplifier and operable to measure an amplitude of the output oscillation, compare the amplitude to a reference voltage and generate a control signal in response to the comparison to control a gain of the amplifier; wherein the control signal sets the gain of the amplifier to operate at a critical gain condition of oscillation to prevent the amplitude of the output oscillation from exceeding a linear region limit of the amplifier.

6. The oscillator system of claim 1, wherein the amplifier is a first amplifier and is operable to inject a first current into the LC oscillator tank, and wherein the frequency stabilizer circuitry further includes: a second amplifier coupled to the LC oscillator tank and operable to inject a second current into the LC oscillator tank; wherein a phase shift between the first current and the second current produces a non-zero phase across the LC oscillator tank that is substantially equal to the temperature null phase.

7. The oscillator system of claim 1, wherein the LC oscillator tank and the amplifier comprise a reference oscillator and wherein the frequency stabilizer circuitry further includes: a phase locked loop (PLL) having: a phase detector coupled to receive the output oscillation and a feedback signal and operable to generate a phase error output signal indicative of a difference in phase between the output oscillation and the feedback signal, the phase error output signal being equal to zero when the output oscillation and the feedback signal are shifted by a constant phase; and a PLL oscillator coupled to receive the phase error output and operable to produce a PLL oscillation as the feedback signal; and a programmable coupling circuit coupled to PLL oscillator and to the reference oscillator and operable to provide a fraction of the PLL oscillation to the reference oscillator to cause the LC oscillator tank of the reference oscillator to oscillate at the temperature null phase.

8. The oscillator system of claim 1, wherein the LC oscillator tank and the amplifier comprise a reference oscillator and wherein the frequency stabilizer circuitry further includes: a delay locked loop (DLL) having: a phase detector coupled to receive the output oscillation and a feedback signal and operable to generate a phase error output signal indicative of a difference in phase between the output oscillation and the feedback signal, the phase error output signal being equal to zero when the output oscillation and the feedback signal are shifted by a constant phase; and a Voltage Controlled Delay Line (VCDL) coupled to receive the phase error output and operable to produce the feedback signal; and a programmable coupling circuit coupled to VCDL and to the reference oscillator and operable to provide a fraction of the feedback signal to the reference oscillator to cause the LC oscillator tank of the reference oscillator to oscillate at the temperature null phase.

9. The oscillator system of claim 1, wherein the LC oscillator tank and the amplifier comprise an oscillator and the frequency stabilizer circuitry further comprises: a frequency stabilizer feedback loop including: a heating element operable to apply a temperature excitation signal superimposed on an operating temperature of the oscillator; a demodulator coupled to the oscillator to receive the output oscillation and operable to demodulate the output oscillation to produce a frequency deviation signal indicative of a frequency deviation produced by the oscillator in response to the temperature excitation signal; a frequency error generator coupled to receive the frequency deviation signal and the temperature excitation signal and operable to produce an error signal proportional to the sensitivity of the oscillator to temperature; and a comparator coupled to receive the error signal and a reference signal and operable to produce a control signal to control the oscillator to allow the LC oscillator tank to operate at the temperature null phase; wherein, at steady state, the error signal has an average value equal to the reference signal.

10. The oscillator system of claim 1, wherein the frequency stabilizer circuitry further includes a controller operable to generate a control signal to set a phase of the LC oscillator tank to the temperature null phase.

11. The oscillator system of claim 1, wherein the controller is operable to measure a frequency of the output oscillation across various phases of the LC oscillator tank at two or more temperatures to determine the temperature null phase as the phase with a minimum frequency difference between the at least two temperatures.

12. The oscillator system of claim 1, wherein the LC oscillator tank includes a differential tank comprising a mismatched pair of LC oscillator tanks to produce a range of phases at which the temperature null phase can be set.

13. The oscillator system of claim 1, comprising a resistance in series with a capacitive part of the LC tank to modify a position of the temperature null phase of the LC tank.

14. The oscillator system of claim 6, wherein the first current and the second current are not equal, and the non-zero value of the phase is dependent upon a magnitude ratio between the first current and the second current and the phase shift between the first current and the second current.

15. The oscillator system of claim 14, wherein the LC oscillator tank, the first amplifier and the second amplifier comprise a first oscillator and further comprising: a second oscillator including: a second LC oscillator tank operable to generate a second tank oscillation having a second temperature null phase at which variations of frequency with temperature changes are minimal; a third amplifier coupled in a feedback loop with the second LC oscillator tank and operable to inject a third current into the second LC oscillator tank; and a fourth amplifier coupled to the second LC oscillator tank and operable to inject a fourth current into the second LC oscillator tank; wherein a quadrature phase shift between the third current and the fourth current produces a non-zero value of the phase across the second LC oscillator tank that is substantially equal to the second temperature null phase; wherein the second oscillator is coupled to the first oscillator in a feedback loop to provide a quadrature voltage to the first amplifier of the first oscillator, the quadrature voltage producing the quadrature phase shift; and wherein the third current and the fourth current are not equal, and the non-zero value of the phase across the second oscillator tank is dependent upon an additional magnitude ratio between the third current and the fourth current.

16. The oscillator system of claim 15, further comprising: automatic amplifier control circuitry coupled to first oscillator and the second oscillator to measure the amplitude of respective output oscillations thereof and coupled to the first amplifier and the second amplifier to control the respective gains thereof and coupled to the third amplifier and the fourth amplifier to control the respective gains thereof based on the measured amplitudes of the respective output oscillations.

17. The oscillator system of claim 9, wherein the frequency error generator includes a mixer coupled to receive the frequency deviation signal and the temperature excitation signal and operable to generate the error signal with an average value proportional to the frequency deviation with temperature, wherein the generated error signal has a positive average value for positive frequency deviations with increasing temperature and a negative average value for negative frequency deviations with increasing temperature.

18. The oscillator system of claim 9, wherein the frequency stabilizer feedback loop operates to trim the oscillator to operate at a minimum temperature sensitivity at a particular temperature.

19. The oscillator system of claim 9, wherein the frequency stabilizer feedback loop further includes: an integrator coupled to the comparator to integrate an output of the comparator and produce an integrated signal; and a low pass filter coupled to receive the integrated signal and operable to filter the integrated signal to produce the control signal.

20. A method for determining the frequency sensitivity of an oscillator to temperature, comprising: applying a temperature excitation signal superimposed on an operating temperature of the oscillator; demodulating an output of the oscillator to produce a frequency deviation signal indicative of a frequency deviation produced by the oscillator in response to the temperature excitation signal; and producing an error signal from the frequency deviation signal and the temperature excitation signal proportional to the frequency sensitivity of the oscillator to temperature.

21. A method for operating an LC-based oscillator, comprising: estimating a temperature null phase of an LC oscillator tank of the LC-based oscillator, the temperature null phase being a phase at which variations in frequency of an output oscillation of the LC-based oscillator with temperature changes are minimized; providing frequency stabilizer circuitry to cause the LC oscillator tank to oscillate at a phase substantially equal to the temperature null phase; and operating the LC-based oscillator with the LC tank oscillating at the phase substantially equal to the temperature null phase.

* * * * *